United States Patent [19]
Bowen et al.

[11] Patent Number: 5,598,050
[45] Date of Patent: Jan. 28, 1997

[54] ACOUSTIC ACTUATOR AND FLEXTENSIONAL COVER PLATE THEREFOR

[75] Inventors: Leslie J. Bowen, Concord; Richard L. Gentilman, Acton, both of Mass.

[73] Assignee: Materials Systems Inc., Littleton, Mass.

[21] Appl. No.: 392,548

[22] Filed: Feb. 17, 1995

[51] Int. Cl.⁶ ................................................. H01L 41/08
[52] U.S. Cl. ........................... 310/322; 310/331; 310/367
[58] Field of Search ...................................... 310/322, 324, 310/328, 330–332, 358, 366, 367; 381/190

[56] References Cited

U.S. PATENT DOCUMENTS

| | | | |
|---|---|---|---|
| 3,181,016 | 4/1965 | Rosenman | 310/332 |
| 4,339,682 | 7/1982 | Toda et al. | 310/321 |
| 5,049,775 | 9/1991 | Smits | 310/328 |
| 5,311,219 | 5/1994 | Ochiai et al. | 310/328 X |
| 5,340,510 | 8/1994 | Bowen | 264/22 |
| 5,418,418 | 5/1995 | Hirano et al. | 310/328 |
| 5,451,827 | 9/1995 | Takagi | 310/358 |

OTHER PUBLICATIONS

Q. M. Zhang et al., *J. Mat. Sci.* 28 (1993) 3962–3968.
G. Haertling, *Proc. 6th US Japan Sem. on Diel. & Piezoel. Cer.* (1993) 168–171.
D. Boucher, *3d Int. Workshop, Transducers for Sonics & Ultrasonics*, Orlando (May 6–8, 1992) 17–37.
E. F. Rynne, *3d Int. Workshop, Transducers for Sonics & Ultrasonics*, Orlando (May 6–8, 1992) 38–49.

*Primary Examiner*—Mark O. Budd
*Attorney, Agent, or Firm*—Frances P. Craig

[57] ABSTRACT

A flextensional cover plate for redirecting the vibrational displacement of terminal ends of at least one pair of piezoelectric or electrostrictive ceramic bender elements vibrating toward and away from each other. The flextensional cover plate includes at least one flexible pleat configured to be bondable to terminal ends of the bender elements such that the bender element vibrational displacement is converted to vibrational displacement of said cover plate in a direction normal to said element vibrational displacement. The preferred flextensional cover plate is configured such that the amplitude of the cover plate vibrational displacement is greater than that of the bender element vibrational displacement. Also disclosed are an acoustic actuator panel including the flextensional cover plate, a method for redirecting vibrational displacement of terminal ends of at least one pair of piezoelectric or electrostrictive ceramic bender elements toward and away from each other, and methods for fabricating the flextensional cover plate and acoustic actuator panel.

11 Claims, 3 Drawing Sheets

ACOUSTIC ACTUATOR AND FLEXTENSIONAL COVER PLATE THERE FOR

BACKGROUND OF THE INVENTION

The present invention relates to acoustic actuators suitable for air-acoustic and hydrodynamic applications. The invention particularly relates to acoustic actuator panels based on piezoelectric or electrostrictive ceramic arrays similar to those used as the ceramic component of a 2—2 or 1-3 ceramic/polymer composite transducer, described below, and to methods for fabricating such actuator panels.

Piezoelectric and electrostrictive ceramic/polymer composite transducer materials have been identified as having significant potential for improving the performance of many acoustic systems. Two of the most important composite configurations are those exhibiting the so-called 1-3 and 2—2 connectivity described in detail in U.S. Pat. No. 5,340,510, to Leslie J. Bowen, one of the inventors of the present application. (U.S. Pat. No. 5,340,510 is incorporated herein by reference.) The 1-3 composite is a one-dimensionally connected piezoelectric or electrostrictive ceramic phase, e.g., lead zirconate titanate (PZT) fibers, rods, or posts contained within a three-dimensionally connected polymer phase. The 2—2 composite is made up of two-dimensionally connected ceramic, e.g., PZT strips separated by two-dimensionally connected parallel polymer strips.

Specific potential applications for such acoustic systems include: undersea imaging, inspection, and surveying; acoustic signature control; acoustic noise and structural vibration suppression; medical diagnostic imaging; and industrial process control and nondestructive evaluation.

The efficient production of the composite transducers described in U.S. Pat. No. 5,340,510 and their performance advantages in hydrostatic transducer applications have been demonstrated. However, the applications to which these transducers are suited are limited by the element displacement available using the specific configurations described. Higher displacements will be required to generate useful, e.g., acoustic pressure levels (about 100dB) at low frequencies (e.g., about 100 Hz) in air and other low acoustic impedance media.

Tubular elements used in 1-3 composite arrays have proven beneficial in hydrophone applications (Zhang et al., *J. Mat. Sci.* 28, pp. 3962–3968 (1993), incorporated herein by reference), since they exhibit a high displacement at very low voltages. However, the cost of the tubular ceramic element composites known in the prior art is prohibitive, and displacement obtainable with arrays of such prior art tubular elements is still insufficient for air-acoustic applications.

In another context, transducers are known which exploit the flextensional properties of a flexible shell surrounding a piezoelectric driver element. Such flextensional transducers are defined in accordance with the shape of the shell, as described in the following papers, both incorporated herein by reference: D. Boucher, "New Solutions for Low Frequency Sonar Projectors" and E. F. Rynne, "Innovative Approaches for Generating High Power, Low Frequency Sound", both presented at *The 3d International Workshop, Transducers for Sonics and Ultrasonics* at Orlando, Fla., May 6–8, 1992 and published in its *Proceedings*, pp. 25 and 38, respectively. However, the displacement achievable with these flextensional transducers is too small and the transducers are too massive and stiff for many applications. Further, a thin, planar acoustic actuator is not achievable with such designs.

Accordingly, it is an object of the present invention to provide a flextensional cover plate for redirecting the vibrational displacement of terminal ends of at least one pair of piezoelectric or electrostrictive ceramic bender elements vibrating toward and away from each other.

It is another object of this invention to provide a method for redirecting such terminal end vibrational displacement, and for amplifying the displacement by flextensional means.

It is yet another object of the present invention to provide an acoustic actuator panel configuration exhibiting a sufficiently high element displacement for air-acoustic as well as hydrodynamic applications.

Still other objects of this invention provide methods for fabricating such actuator panels and flextensional cover plates.

SUMMARY OF THE INVENTION

In one aspect, the invention is a flextensional cover plate for redirecting the vibrational displacement of terminal ends of at least one pair of piezoelectric or electrostrictive ceramic bender elements vibrating toward and away from each other. The flextensional cover plate includes at least one flexible pleat configured to be bondable to terminal ends of the bender elements such that the bender element vibrational displacement is converted to vibrational displacement of said cover plate in a direction normal to said element vibrational displacement. In a preferred, narrower embodiment, the flextensional cover plate is configured such that the amplitude of the cover plate vibrational displacement is greater than that of the bender element vibrational displacement.

In another aspect, the invention is an acoustic actuator panel including a flextensional cover plate and at least one pair of piezoelectric or electrostrictive ceramic bender elements. The flextensional cover plate includes one or more flexible pleats. The bender elements are configured, on actuation, to vibrate toward and away from each other at their terminal ends in vibrational displacement and said cover plate flexible pleats are bonded to said terminal ends such that said bender element vibrational displacement is converted to vibrational displacement of said cover plate in a direction normal to said bender element vibrational displacement. In a narrower embodiment, the pair of bender elements are incorporated in an electrically actuable, strongly piezoelectric or electrostrictive ceramic body including a plurality of such pairs of bender elements extending perpendicularly from a rigid, generally planar base in a preselected array. Actuation of the ceramic body causes bender element vibrational displacement in a direction parallel to the base. The cover plate pleat is one of a plurality of like pleats bonded to the terminal ends of the pairs of bender elements. In another narrower embodiment, the bender elements are thin, rectangular, plate-like bender elements each joined to said base along one long edge, said bender element array and said base being configured such that a plurality of parallel troughs is formed between said bender elements.

In yet another aspect, the invention is a method for redirecting vibrational displacement of terminal ends of at least one pair of piezoelectric or electrostrictive ceramic bender elements toward and away from each other. The method involves the steps of fabricating a cover plate including at least one flexible pleat, and bonding the cover plate flexible pleat to the bender element terminal ends at bonding points on the pleat. The flexible pleat, bonding points, and bender elements are configured such that the bender element vibrational displacement is converted to vibrational displacement of said cover plate in a direction normal to said bender element vibrational displacement.

In still another aspect, the invention is a method for fabricating a flextensional cover plate for redirecting vibrational displacement of terminal ends of piezoelectric or electrostrictive ceramic bender elements toward and away from each other. The method involves the step of forming of a flexible material at least one flexible pleat configured to be bondable to the bender element terminal ends such that said bender element vibrational displacement is converted to vibrational displacement of said cover plate in a direction normal to said bender element vibrational displacement.

In a further aspect, the invention is a method for fabricating an acoustic actuator panel. The method involves the steps of preparing an electrically actuable ceramic body of a piezoelectric or electrostrictive ceramic material, the ceramic body including a plurality of pairs of ceramic bender elements extending perpendicularly from a rigid, generally planar base in a preselected array; establishing electrical contact with the bender elements and poling the ceramic body such that actuation of the ceramic body causes vibrational displacement of terminal ends of the bender elements of each of the pairs toward and away from each other in a direction parallel to the base; forming a cover plate from a flexible material, the cover plate including a plurality of flexible pleats, each pleat configured to be bondable to terminal ends of one of the bender element pairs; and bonding the cover plate pleats to the bender element terminal ends such that the bender element vibrational displacement is converted to vibrational displacement of the cover plate in a direction normal to the bender element vibrational displacement.

BRIEF DESCRIPTION OF THE DRAWINGS

For a better understanding of the present invention, together with other objects, advantages, and capabilities thereof, reference is made to the following Description and appended Claims, together with the Drawing in which:

DETAILED DESCRIPTION OF THE PREFERRED EMBODIMENTS

An exemplary embodiment of the actuator panel in accordance with the invention is an acoustic actuator panel having an electroded piezoelectric ceramic bender device and a flextensional amplifying cover plate fixed to the upper surface of the bender device. The bender device has a piezoelectric lead zirconate titanate (PZT) base and bender elements, and has a configuration similar to the ceramic portion of a 2—2 ceramic/polymer composite. This configuration is described further below. The ceramic is poled and electroded for activation of the device to cause the elements to act as piezoelectric benders operating toward and away from one another, as also described in further detail below.

Figure 1A:
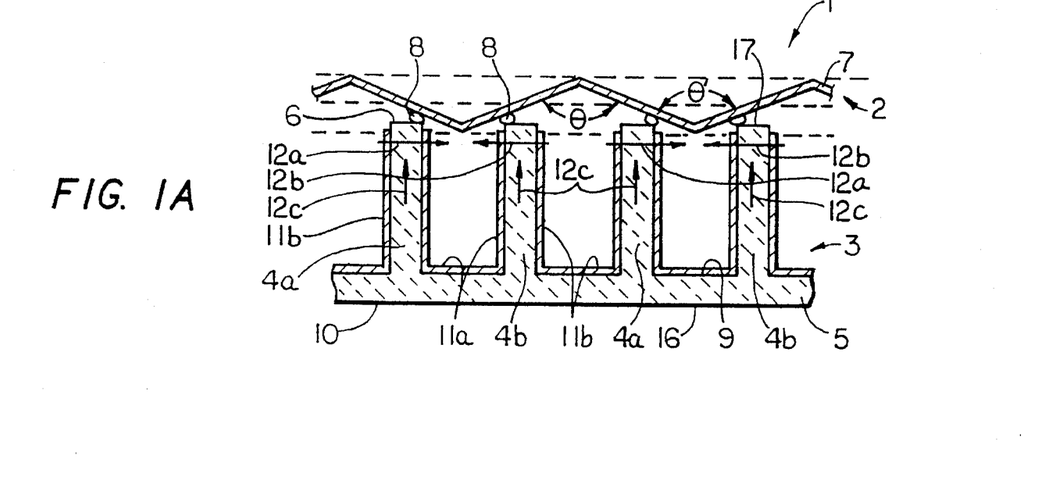
FIGS. 1A–1C are cross-sectional elevational views schematically illustrating a flextensional amplifier and actuator panel in accordance with one embodiment of the invention.
Figure 1B:
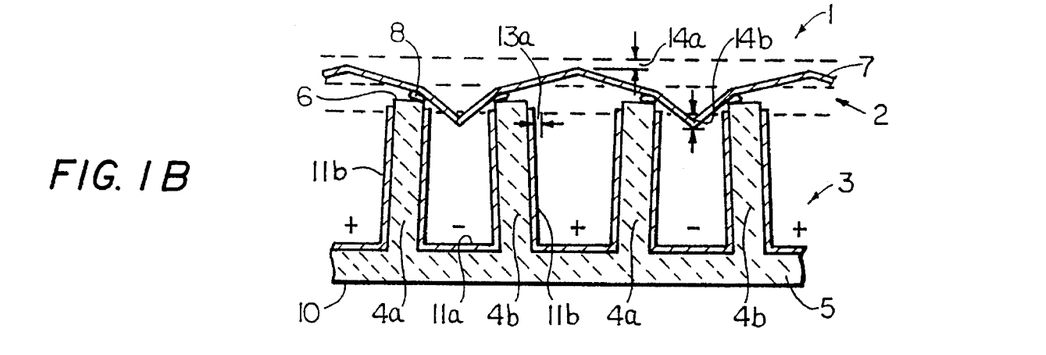
Figure 1C:
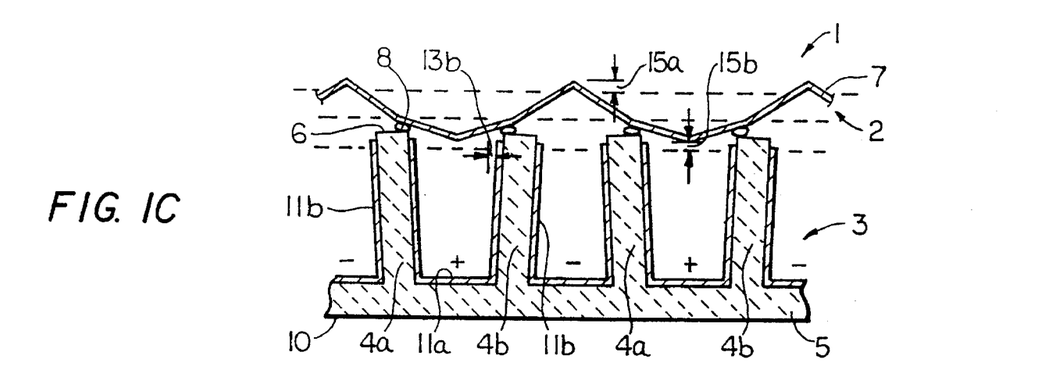

FIGS. 1A–1C illustrate planar acoustic actuator panel 1 including flextensional amplifier 2 and bender device 3. Bender device 3 is configured, poled, and electroded so that actuation of the panel causes vibrational displacement, or "bending", of adjacent ceramic bender elements 4a and 4b of ceramic body 5 toward and away from each other at their upper edges 6, which lie generally in a plane.

FIG. 1A shows actuator panel 1 at rest. Flextensional amplifier 2 includes pleated flexible cover plate 7, about 0.5 mm thick and extending over approximately the entire upper surface of bender device 3. Before activation, pleat angle θ is about 5°–180°, preferably about 45°–180°, more preferably about 45°–135°, most preferably about 75°–105°. For amplification and redirection of the bender element vibration, the preferred mode, a pleat angle θ for the cover plate (when the panel is not activated) of 91°–180° is selected. If only redirection is required, the pleat angle θ may be 5°–90°. Cover plate 7 is fabricated from a pleated polymer or metal, and is adhesively bonded to exposed element edges 6, e.g, by epoxy adhesive 8, in such a way that the bender element vibrational displacement is converted to vibrational flexing of the cover plate in a direction normal to the upper surface of the bender device. The flexing amplitude achievable with such an acoustic actuator panel can be sufficient for airacoustic and hydrodynamic applications, for example, 100 µm or more. Alternatively, other means may be used to bond cover plate 7 to element edges 6, e.g., by coating edges 6 with a polymer and heat sealing the cover plate thereto.

Electrical contact for actuation is established with the bender elements as follows. Troughs 9 between bender elements 4a and 4b are defined by base 10 of ceramic body 5 and one side each of two adjacent bender elements 4a and 4b. Each trough 9 is plated or coated with a metal, alloy, or other electrical contact material to provide electrodes 11a and 11b, the contact material extending up the sides of the bender elements to line each trough. The contact material preferably is no thicker than required to serve the purpose of providing electrodes, and extends to but does not cover upper edges 6 of bender elements 4a and 4b. Electrodes 11a and 11b from adjacent troughs thus are electrically isolated from one another. Alternate electrodes 11a may then be connected to one of two common electrical connections, e.g., bus bars (not shown) running along one edge (shown in FIG. 2) of the ceramic body, while alternate electrodes 11b may be connected to the other of the two common electrical connections, this connection running along the opposite ceramic body edge. Thus, two sets of electroded bender elements, 4a and 4b, are created which are interdigitally related to each other. Bender elements 4a and 4b then may be oppositely actuated, as shown by arrows 12a and 12b in FIG. 1A.

In a preferred embodiment, ceramic bender elements 4a and 4b are poled in the direction of their height, as shown in FIG. 1A by arrows 12c, by applying a sufficiently high electric field between ceramic base 5 and bender element edges 6. For this purpose, temporary electrodes, e.g., of silver paint, (not shown) may be applied to the underside of base 5 and to bender element edges 6, then removed, e.g., by polishing, before applying permanent electrodes 11a and 11b and attaching cover plate 2. Alternatively, the poling direction may be reversed, but should be in the same direction for all bender elements.

Actuation of panel 1 is illustrated in FIGS. 1B and 1C. The sinusoidal reversal of the voltage provided to electrodes 11a and 11b by an ac voltage source, causes vibrational displacement, or "bending", of adjacent bender elements 4a and 4b toward and away from each other at their upper edges 6 at the upper surface of bender device 3. The first half-sinewave of the voltage applied to each electrode 11a or 11b causes bending of each bender element 4a toward one adjacent bender element 4b, as shown in FIG. 1B, the amplitude at edge 6 being shown at 13a. The second half-sinewave causes bending of each bender element 4a to the bender element 4b on the other side, as shown in FIG. 1C, the amplitude at edge 6 being shown at 13b. Ceramic base 10 keeps the opposite, lower edges of bender elements 4a and 4b separated. Thus, the vibrational displacement of the bender device is flexural, rather than longitudinal as described in above-mentioned U.S. Pat. No. 5,340,510, increasing the possible vibrational amplitude of the ceramic elements by as much as an order of magnitude.

Still higher amplitudes can be generated by proper configuration of flextensional amplifier 2, as described below. Flexible pleated cover plate 7 of flextensional amplifier 2 converts the bender element vibrational displacement to vibrational flexing of the cover plate in a direction normal to the upper surface of the bender device. The positive and negative displacement of cover plate 7 with this vibrational flexing is shown at 14a and 14b (negative) in FIG. 1B and at 15a and 15b (positive) in FIG. 1C. The amplitude of vibration of the flexing cover plate is now in phase and of the same sign over the entire surface of the cover plate. A typical thickness for cover plate 7 is about 0.1–1 mm, and the width and length are sufficient to cover the bender elements, typically approximately the same area as that of ceramic body 5.

The amplitude of the vibrational displacement of bender elements 4a and 4b, as shown at 13a and 13b in FIGS. 1B and 1C, respectively, depends on the geometry of bender elements 4a and 4b, the voltage applied, and the piezoelectric coefficient of the ceramic material. The cover plate flexural amplitude is dependent not only on the bender element displacement amplitude, but also on the geometry of the cover plate and the spacing of the bender elements (trough width), and can be significantly greater than the displacement amplitude. Proper design of the component parts of such an actuator panel can produce a flexural amplitude sufficient for air-acoustic and hydrodynamic applications. In one example of such component design, the bender elements are 12 mm high and 1 mm thick, the trough width is 10 mm, and angle $\theta$ is 157°.

Figure 2:
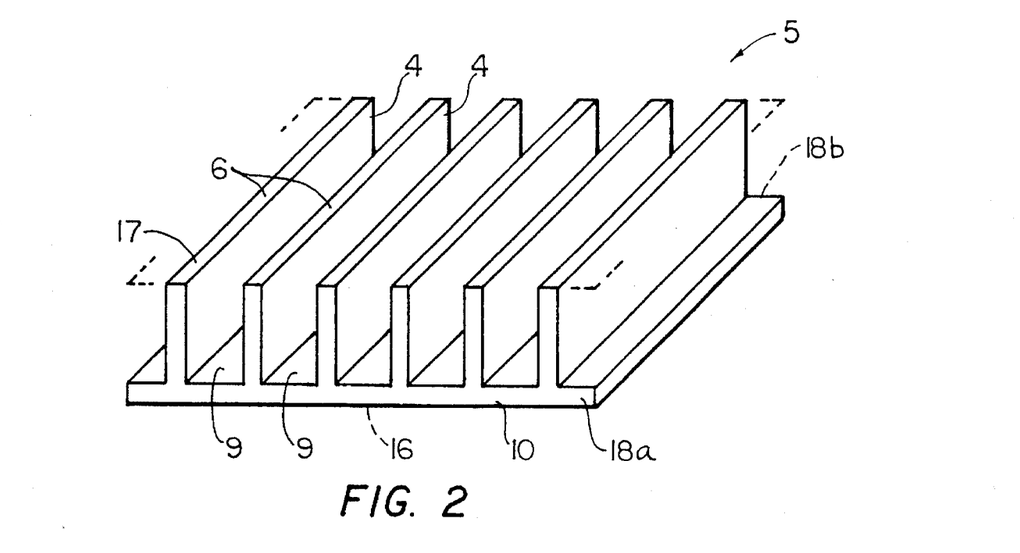
FIG. 2 is a perspective view schematically illustrating the ceramic body of FIGS. 1A–1C.

FIG. 2 illustrates preferred ceramic body 5 in further detail. Ceramic body 5 is molded or otherwise shaped to have a generally planar, dense PZT base 10 providing lower surface 16 of the bender device. Extending perpendicularly from base 10 is a plurality of dense PZT bender elements 4 integral with base 10. Bender elements 4 in this preferred embodiment are solid, parallel, rectangular, densified, piezoelectric ceramic strips separated by troughs 9. Typical dimensions for composite body 5 are about 5×5×1 cm, with a 1 mm thick base, bender elements about 1 mm thick and 9 mm high and extending the full length of ceramic body 5, and troughs between the bender elements typically are about 5 mm wide. PZT bender elements 4 extend from base 10 to generally planar upper surface 17 of ceramic body 5 in a regularly spaced array. Upper edges 6 of bender elements 5 are shown in FIG. 2 as rectangularly shaped, e.g., by molding or machining. Alternatively, the upper edges may be rounded or may be shaped to facilitate cover plate attachment. Electrodes in alternate troughs may be interconnected, as described above, along edge 18a or 18b of ceramic body 5.

In the above-described acoustic actuator panel the ceramic material is a lead zirconate titanate and the cover plate is fabricated from a polyethylene material. In alternative embodiments, the ceramic material may be a lead magnesium niobate, a titanate of lead, barium, bismuth, or strontium, or a derivative of any of these materials. In other alternate embodiments, the ceramic bender elements may be fixed to a non-integral base or even a non-ceramic base, for example, a rigid polymeric material. In still other alternate embodiments, the cover plate may be fabricated from a metal, e.g., aluminum, brass, or steel; a polymeric material, e.g., a polypropylene, or polycarbonate; or a reinforced polymeric material, e.g., a polypropylene, polycarbonate, polyethylene, or polyvinyl chloride material reinforced with glass or steel fibers.

The geometries of the ceramic body and the cover plate may also vary. For example, in preferred embodiments, the ceramic body may be about 5–100 mm long by 5–100 mm wide by 2–20 mm thick, the base may be about 0.2–2 mm thick, the elements may be about 0.2–2 mm thick by about 2–20 mm high, and the cover plate may be 0.25–1 mm thick with angles $\theta$ of about 90°–175° (greater than 90° for amplification).

The strip-shaped bender elements may also be hollow, with reinforcing bridge members. Each hollow bender element extends perpendicularly from the base, and has a closed upper edge and is open at the lower surface of the base. One electrode covers the upper surface of the ceramic body, including the troughs and bender element outer surfaces, and the other electrode covers the lower surfaces, including the lower surface of the base and the inner surfaces of the bender elements. The bender elements are pre-poled to permit the above-described bender element vibrational displacement. A flextensional amplifier similar to those described above is used, e.g., one including a pleated cover plate adhesively bonded to the upper edges of the bender elements. Actuation of the panel causes vibrational displacement of adjacent bender elements, which is converted to vibrational flexing of the cover plate in a direction normal to the upper surface of the ceramic body, as described above.

The configuration of the ceramic body of the bender device may also vary in other ways. For example, the ceramic body may be similar to the ceramic phase of a composite having a 1–3 connectivity, with individual solid rod-shaped elements or tubular elements interconnected by a base similar to that described above for the 2—2-type ceramic body. The tubular elements are open at the lower planar surface of the ceramic body but are closed at their upper ends. The closed ends may be molded in, e.g., by injection molding, or may be capped with ceramic, epoxy, or rigid polymeric material. Electroding for each of these 1–3-type ceramic body configurations is similar to that described for the parallel solid or hollow 2—2-type ceramic body, and a similar flextensional amplifier is used. For example, the flextensional cover plate may include a pleated cover plate adhesively bonded to the upper ends of the rod or tubular bender elements. Actuation of the panel causes vibrational displacement of adjacent rows of bender elements, which is converted to vibrational flexing of the cover plate in a direction normal to the upper surface of the composite, as described above. The actuator performance for a particular application may be optimized by selecting the configuration and geometry of the composite ceramic phase and the pleated cover plate.

Figure 3A:
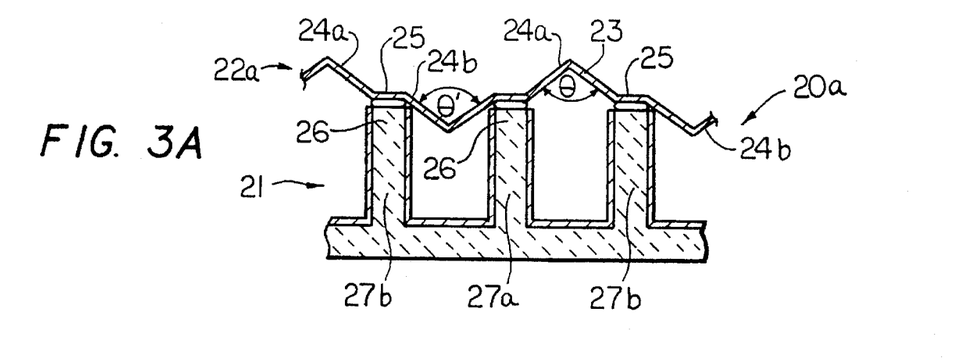
FIGS. 3A–3C are cross-sectional elevational views schematically illustrating various flextensional amplifiers panel in accordance with other embodiments of the invention.
Figure 3B:
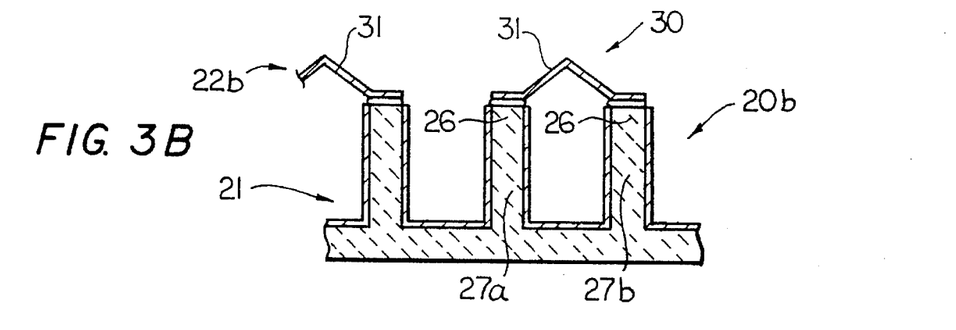
Figure 3C:
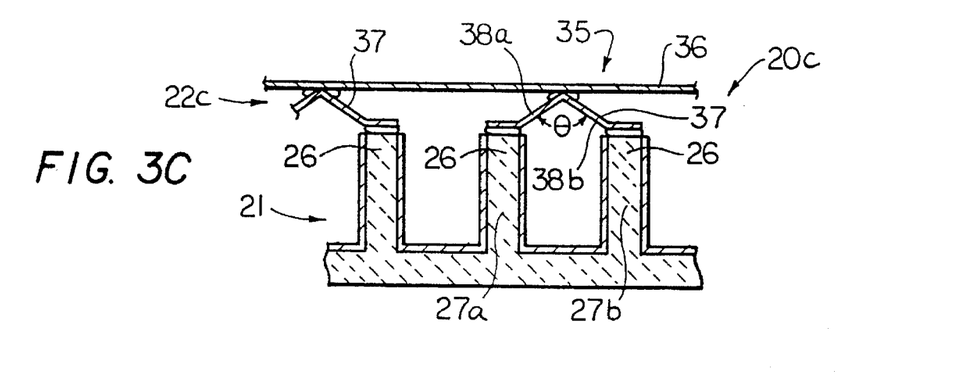

Several variations of flextensional amplifiers in accordance with the invention are illustrated in FIGS. 3A–3C. FIG. 3A shows actuator panel 20a including electroded bender element 21 and flextensional amplifier 22a bonded, as described above, thereto. Flextensional amplifier 22a is formed from a single flexible polymeric cover plate sheet 23 similar to cover plate 7 of FIGS. 1A–1C. Sheet 23 is folded by conventional means, e.g., by heat setting, into positive pleats 24a and negative pleats 24b. In this embodiment, additional folds have been made in sheet 23 between pleats 24a and 24b to provide conforming bonding sites 25 for bonding sheet 23 to upper edges 26 of bender elements 27a and 27b, but this feature is optional. Angle θ of pleats 24a and angle θ' of pleats 24b are greater than 90° for amplification of the vibrational displacement of bender elements 27 and, in this embodiment, are approximately equal. Activation of the device causes bending of adjacent bender elements 27a and 27b toward and away from one another at their edges 26. This bending in turn results in flexing of both positive pleats 24a and negative pleats 24b to push sheet 23 away from and toward bender device 21. The amplitude of this vibrational displacement of sheet 23 is greater than that of bender elements 27a and 27b at their edges 26.

FIG. 3B shows a similar flextensional amplifier to that shown in FIG. 3A. Cover plate 30 includes separated positive pleats 31 bonded to upper edges 26 of bender elements 27a and 27b. Cover plate 30 may conveniently be fabricated from cover plate sheet 23 of FIG. 3A by removing negative pleats 24b before or after bonding of sheet 23 to bender device 21. On activation of the device, pleats 31 operate in a manner similar to that of positive pleats 24a to amplify the vibrational displacement of elements 27a and 27b.

FIG. 3C shows a preferred type of flextensional amplifier. Flexible cover plate 35 includes planar portion 36 supported by folded or pleated portions or pleats 37, each pleat including two arms 38a and 38b which form angle θ. Before activation, angle θ is about 90°–180°, preferably at least about 91° for amplification to occur. The pleats may be either positive pleats 37 alone, as shown and preferred, or may include both positive and negative pleats, a less preferred embodiment not shown. Each arm 38a is bonded to an upper edge 26 of one bender element 27a, as described above; each arm 38b is similarly attached to one bender element 27b. Cover plate planar portion 36 and pleats 37 may be separately fabricated from identical or different materials and bonded together as shown. Alternatively, the cover plate and pleats may be coextruded from the same or different polymeric materials. In one embodiment, a cover plate sheet similar to that shown in FIG. 3A is folded into positive and negative pleats and bonded to the planar member. The negative pleats may be removed, if desired, before or after bonding. On activation of the device, pleats 37 operate in a manner similar to that of positive pleats 24a to amplify the vibrational displacement of elements 27a and 27b. Cover plate planar portion 36 moves upward and downward with pleats 37; thus planar portion 36 is the interface between the transducer and its medium, e.g., air or water. This eliminates the low displacement regions near the cover plate attachment points, providing more uniform, in-phase actuation.

Figure 4:
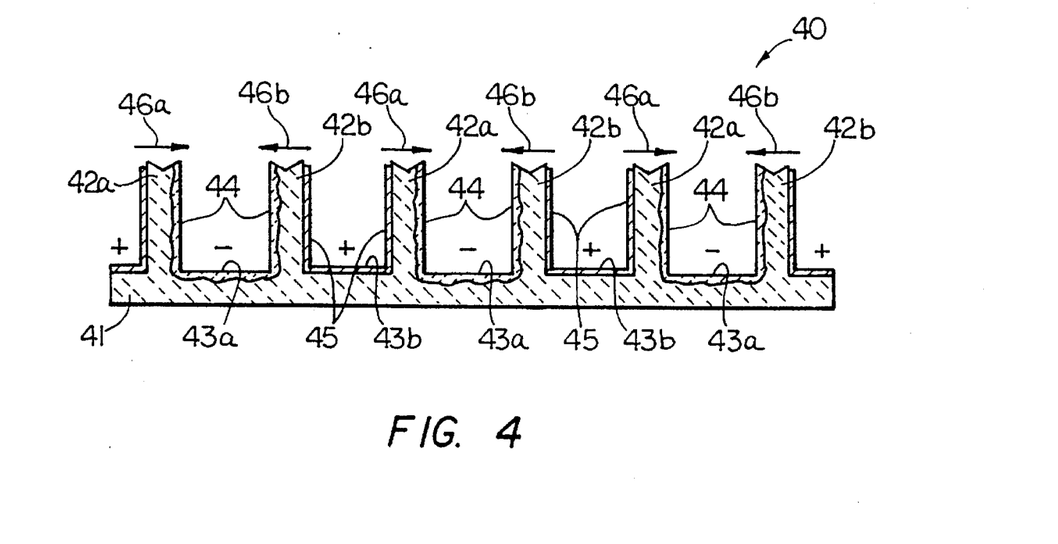
FIG. 4 is a cross sectional elevational view of a ceramic body useful in an actuator panel in accordance with another embodiment of the invention.

The bender device of yet another embodiment of the actuator panel is illustrated in FIG. 4. Bender device 40 is fabricated from a 2—2-type ceramic body, and includes base 41 and rectangular solid bender elements 42a and 42b separated by troughs 43a and 43b. Alternate troughs 43b are electroded as described above, while alternate troughs 43a have been treated to produce a pre-stressed "RAINBOW" effect in the piezoelectric or electrostrictive materials before electroding, to bend pairs of bender elements 42a and 42b toward and away from each other. The RAINBOW effect is described by G. Haertling in "Stress-Biased Piezoelectric Ceramics for Actuator Applications" (*Proc. 6th US-Japan Seminar on Dielectric and Piezoelectric Ceramics*, pp. 168–171 (1993)), incorporated herein by reference.

The term "RAINBOW" is an acronym for Reduced And INternally Biased Oxide Wafer, but the strain amplifying effect may be produced in other ceramic geometries as well by similar localized high temperature chemical reduction processes. A chemically reduced layer is produced on a localized surface of a ferroelectric material, which leads to very high displacements and enhanced load-bearing ability.

To produce a RAINBOW effect in device 40, close fitting graphite blocks (not shown) are inserted only into the area to be treated, in this case into troughs 43a, and the body is heated to a temperature sufficient to produce the desired chemical reduction. For example, device 40 may be placed into an oven at about 975° C. for about 1 hour. The part is then cooled to ambient temperature in air, the graphite blocks are removed, and the body is abraded lightly in treated troughs 43a to remove any metallic lead particles present on the treated surface and to expose reduced layers 44. Untreated troughs 43b are then electroded to produce electrodes 45, as described above, and the bender elements are poled as shown at arrows 46a and 46b. Bender device 40 may then be actuated to generate bending action as a monomorph. A flextensional amplifier, as described above, then may be attached to convert the vibrational displacement of the bender elements to vibrational flexing of the cover plate.

In a preferred method for fabricating the ceramic body of the actuator panel of the invention, the ceramic body is injection molded using techniques similar to those disclosed in U.S. Pat. No. 5,340,510. Alternatively, other known means may be used to fabricate the ceramic phase and the composite, e.g., slip casting or wafer dicing techniques, pressing of ceramic powder, or automatic or manual fiber placing techniques, with encapsulation, as disclosed in U.S. Pat. No. 5,340,510 and references cited therein. The ceramic body is electroded by conventional means.

The flextensional amplifier embodiments of FIGS. 1A–1C and 3A–3C may be molded in their as-used shape, or machined or cut to shape. Preferably, however, it is molded, injection molded, or extruded from a thermoplastic material, then heat softened and shaped by remolding techniques. For example, in one embodiment the flextensional amplifier may be extruded as a planar sheet, then heat softened and pressed into a mold or vacuum molded to achieve the desired pleated profile. The cover plate pleats may be bonded using adhesives or heat bonding, or may be adhesively bonded directly to the bender elements themselves.

The preferred method for fabricating the flextensional amplifier embodiment of FIG. 3C is extrusion, since the profile remains unchanged across one dimension of the actuator panel. For use with a 1-3-type ceramic body, the extruded blank may be used as is or may be cut or machined to remove excess arm material to create a separate arm for each element. Alternatively, the amplifier may be assembled by bonding from several components, e.g., a planar portion and several pre-pleated portions or separate arms. The ceramic body and flextensional amplifier of this embodiment may be assembled, e.g., by adhesively bonding the pleats or arms directly onto the elements, e.g., using an epoxy adhesive; by pre-dipping the element upper ends in a thermoplastic adhesive and heat bonding the pleats, arms, or cups thereto; or by providing intermediate rods bonded within grooves in the elements, as described above. Another example is a metal foil cover plate, molded by pressing, and attached adhesively or by soldering, brazing, or other means commonly known for bonding metals to ceramics.

In one example of an assembly technique, the flextensional amplifier of FIGS. 1A–1C is assembled as follows: A blank of cover plate 7 is extruded as a planar sheet about 0.5 mm thick and of a size to be approximately equal in area, after pleating, to ceramic body 5. The planar cover plate blank is placed in a metal mold having the shape of the desired pleats at its inner surface. The mold is heated to soften the blank, and applied pressure or gravity causes the softened sheet form blank to conform to the pleated inner surface of the mold. Ceramic body 5, with bender element edges 6 pre-coated with adhesive, is then carefully placed upside-down into the mold such that edges 6 contact cover plate 7 in the appropriate symmetrical arrangement. The heat from the metal mold softens the adhesive on edges 6, bonding pleated cover plate 7 to bender elements 4a and 4b. The assembled actuator panel is then cooled and removed from the mold.

The actuator panels disclosed herein can be actuated at high amplitude using strain amplification, and are useful for both air acoustic and hydrodynamic applications. Specific applications include undersea imaging; acoustic signature control; medical diagnostic imaging; nondestructive evaluation; hydrodynamic flow control; reduction of airborne acoustic noise; suppression of structural vibration; and industrial processes.

While there have been shown and described what are at present considered the preferred embodiments of the invention, it will be apparent to those skilled in the art that modifications and changes can be made therein without departing from the scope of the present invention as defined by the appended claims.

We claim:

1. A flextensional cover plate for redirecting the vibrational displacement of terminal ends of at least two pairs of bender elements, wherein the elements of each pair vibrate toward and away from each other, said flextensional cover plate comprising:

at least two flexible pleats each configured to be bondable to terminal ends of one of said pairs of said bender elements; and a planar member disposed parallel to said bender element vibrational displacement and bonded to or unitary with said pleats, said planar member being interconnected by said flexible pleats to said terminal ends, and said flextensional cover plate being configured such that, on actuation, said bender element vibrational displacement results in flexing of said flexible pleats and said flexing results in cover plate vibrational displacement at said planar member in a direction normal to said element vibrational displacement.

2. A flextensional cover plate in accordance with claim 1 wherein said flextensional cover plate is configured such that the amplitude of said cover plate vibrational displacement is greater than that of said bender element vibrational displacement.

3. A flextensional cover plate in accordance with claim 1 comprising a flexible sheet material folded to form said flexible pleats.

4. A flextensional cover plate in accordance with claim 1 fabricated from one or more flexible materials selected from the group consisting of metals, polymeric materials, and reinforced polymeric materials.

5. An acoustic actuator panel comprising:

an electrically actuable, strongly piezoelectric or electrostrictive, unitary ceramic body comprising a plurality of pairs of bender elements extending perpendicularly from a rigid, generally planar base in a preselected array, said ceramic body being configured such that, on actuation, said bender elements of each of said pairs vibrate toward and away from each other at their terminal ends in vibrational displacement in a direction generally parallel to said base; and a flextensional cover plate comprising one or more flexible pleats, wherein each of said cover plate flexible pleats is bonded to said terminal ends of one of said pairs of bender elements such that said bender element vibrational displacement is converted to vibrational displacement of said cover plate in a direction normal to said bender element vibrational displacement.

6. An acoustic actuator panel in accordance with claim 5, wherein:

said flextensional cover plate comprises at least two of said flexible pleats and a planar member disposed parallel to said bender element vibrational displacement and bonded to or unitary with said pleats;

said planar member is interconnected by said flexible pleats to said terminal ends; and said flextensional cover plate is configured such that, on actuation, said bender element vibrational displacement results in flexing of said flexible pleats and said flexing results in cover plate vibrational displacement at said planar member in a direction normal to said element vibrational displacement.

7. An acoustic actuator panel comprising:

a body comprising a plurality of pairs of electrically actuable, strongly piezoelectric or electrostrictive ceramic bender elements extending perpendicularly from a rigid, generally planar base in a preselected array, said ceramic body being configured such that, on actuation, said bender elements of each of said pairs vibrate toward and away from each other at their terminal ends in vibrational displacement in a direction generally parallel to said base; and a flextensional cover plate comprising one or more flexible pleats, wherein each of said cover plate flexible pleats is bonded to said terminal ends of one of said pairs of bender elements such that said bender element vibrational displacement is converted to vibrational displacement of said cover plate in a direction normal to said bender element vibrational displacement.

8. An acoustic actuator panel in accordance with claim 7, wherein:

said flextensional cover plate comprises at least two of said flexible pleats and a planar member disposed parallel to said bender element vibrational displacement and bonded to or unitary with said pleats;

said planar member is interconnected by said flexible pleats to said terminal ends; and said flextensional cover plate is configured such that, on actuation, said bender element vibrational displacement results in flexing of said flexible pleats and said flexing results in cover plate vibrational displacement at said planar member in a direction normal to said element vibrational displacement.

9. An acoustic actuator panel in accordance with claim 7 wherein said bender elements are thin, rectangular, plate-like bender elements each joined to said base along one long edge, said bender element array and said base being configured such that a plurality of parallel troughs is formed between said bender elements.

10. An acoustic actuator panel in accordance with claim 9 further comprising electrical actuation means establishing electrical contact with said bender elements in alternate ones of said troughs, and wherein the remaining ones of said troughs include a non-piezoelectric or non-electrostrictive region at surfaces of each of said remaining troughs, such that said piezoelectric and non-piezoelectric or said electrostrictive and non-electrostrictive regions combine to form said bender elements.

11. An acoustic actuator panel in accordance with claim 7 wherein said ceramic material is a lead zirconate titanate; a lead magnesium niobate; a titanate of lead, barium, bismuth, or strontium; or a derivative thereof.

* * * * *

UNITED STATES PATENT AND TRADEMARK OFFICE
CERTIFICATE OF CORRECTION

PATENT NO. : 5,598,050
DATED : January 28, 1997
INVENTOR(S) : Leslie J. Bowen and Richard L. Gentilman It is certified that error appears in the above-indentified patent and that said Letters Patent is hereby corrected as shown below:

Column 1, line 5, should read as follows:

CONTRACT INFORMATION

This invention was made with government support under Contract No. N0014-95-0054 awarded by the Department of the Navy. The Government has certain rights in this invention.

Signed and Sealed this

Sixth Day of May, 1997

Attest:

BRUCE LEHMAN

Attesting Officer

Commissioner of Patents and Trademarks